United States Patent [19]

Mang et al.

[11] Patent Number: 5,692,279
[45] Date of Patent: Dec. 2, 1997

[54] METHOD OF MAKING A MONOLITHIC THIN FILM RESONATOR LATTICE FILTER

[75] Inventors: Luke Mang; Fred S. Hickernell, both of Phoenix, Ariz.; Robert G. Kinsman, Naperville, Ill.

[73] Assignee: Motorola, Schaumburg, Ill.

[21] Appl. No.: 516,220

[22] Filed: Aug. 17, 1995

[51] Int. Cl.⁶ .................................................. H01L 41/22
[52] U.S. Cl. ........................ 29/25.35; 310/312; 310/324; 310/334; 310/366; 427/100
[58] Field of Search ..................... 29/25.35; 310/324, 310/334, 312, 366; 427/100

[56] References Cited

U.S. PATENT DOCUMENTS

| | | | |
|---|---|---|---|
| 4,130,771 | 12/1978 | Bottom | 310/312 |
| 4,262,227 | 4/1981 | Ikeno et al. | 310/312 |
| 4,456,850 | 6/1984 | Inoue et al. | 310/324 |
| 4,547,748 | 10/1985 | Ballato | 310/366 X |
| 4,634,917 | 1/1987 | Dvorsky et al. | 310/366 X |
| 4,642,508 | 2/1987 | Suzuki et al. | 310/324 X |

FOREIGN PATENT DOCUMENTS

| | | | |
|---|---|---|---|
| 0072277 | 4/1985 | Japan | 310/324 |
| 0075614 | 4/1986 | Japan | 310/324 |

Primary Examiner—Carl E. Hall
Attorney, Agent, or Firm—Eugene A. Parsons

[57] ABSTRACT

A monolithic thin film resonator, lattice filter including spaced apart strips of a conductive film positioned on a substrate so as to define a first set of I/O terminals, a layer of piezoelectric material positioned on the conductive film, and spaced apart conductive strips of a conductive film positioned on the piezoelectric layer orthogonal to the first strips to form cross-over areas, each defining a thin film resonator and a second set of I/O terminals. A plurality of portions of a dielectric film are positioned on selected cross-over areas to mass load the thin film resonators so as to lower the resonant frequency.

8 Claims, 3 Drawing Sheets

METHOD OF MAKING A MONOLITHIC THIN FILM RESONATOR LATTICE FILTER

FIELD OF THE INVENTION

The present invention pertains to thin film resonators and more specifically to thin film resonators in a monolithic lattice filter and methods of fabrication.

BACKGROUND OF THE INVENTION

Piezoelectric filters, specifically surface acoustic wave (SAW) filters on crystalline substrates, are presently used very widely in the hand-held radio field for RF filters and the like. The piezoelectric filters are formed of one or more piezoelectric resonators which can be made small and light and, thus, are especially useful in small portable communication devices.

At lower frequencies (i.e. 10's of MHz) discrete crystal resonators are used in the lattice configuration as filters. However, these discrete resonators are relatively large and expensive to manufacture. Also, discrete resonators require tedious frequency alignment during fabrication and cannot be extended to the higher frequencies, such as 1 to 3 GHz or higher.

Some attempts at using thin film resonators have been made but piezoelectric resonators are very sensitive and must be formed on a relatively rugged substrate of some type. However, in order for the piezoelectric resonator to properly operate it must be decoupled from the substrate or the substrate will damp the resonance, or vibration.

In some prior art devices the decoupling is accomplished by forming the piezoelectric resonator on the surface of a substrate and then etching a cavity substantially through the substrate from the backside. Since the substrate can be relatively thick, this process requires a great amount of very difficult etching and much care is required to ensure that the etching process stops before the piezoelectric device is damaged. Also, because of the angle at which the etch attacks the substrate (approximately 50°), the amount of substrate required and the ultimate size of the resonator are greatly increased.

In some prior art devices the decoupling is accomplished by forming a sacrificial layer on a substrate and then forming a support layer on the sacrificial layer. A piezoelectric device is then formed on the supporting layer and the sacrificial layer is etched away. This leaves the supporting layer extending bridge-like over an air gap, which decouples the piezoelectric device from the substrate. The problem with this method of fabricating piezoelectric devices is that sacrificial layers are difficult to etch because of the large horizontal dimensions (large undercut) or the extent of the material that must be removed.

Generally, thin film resonators are fabricated in the form of stacked filters and ladder filters. However, stacked filters require the deposition of at least two layers of piezoelectric films sandwiched between layers of metal, which substantially increases the fabrication complexity and, hence, the cost of the filter. Also, ladder filters have relatively high insertion loss and are relatively large and costly.

Thus, it would be beneficial to devise a new process for fabricating piezoelectric resonators which is simple and inexpensive and from which piezoelectric resonator filters can be conveniently formed.

It is a purpose of the present invention to provide a new and improved method of fabricating thin film piezoelectric resonator lattice filters.

It is another purpose of the present invention to provide a new and improved method of fabricating thin film piezoelectric resonator lattice filters on a sealed cavity which is substantially easier than prior art methods and much less expensive.

It is still another purpose of the present invention to provide a new and improved thin film piezoelectric resonator lattice filter with greater consistency and reliability.

It is a further purpose of the present invention to provide new and improved thin film piezoelectric resonator lattice filters in a balanced circuit for convenient use with differential circuits and the like.

It is a still further purpose of the present invention to provide new and improved thin film piezoelectric resonator lattice filters, which filters are smaller and easier to fabricate than prior art filters and which filters are less expensive and more reliable than prior art filters.

It is a still further purpose of the present invention to provide new and improved thin film piezoelectric resonator lattice filters, including two resonators somewhat akin to true half-lattice filters, that are smaller than prior art lattice filters and which, in combination with a differential amplifier, provide the simplest known thin film resonator filters that have performance similar to that of a full lattice filter in bandwidth and which provide gain instead of insertion losses.

SUMMARY OF THE INVENTION

The above problems and others are at least partially solved and the above purposes and others are realized in a monolithic thin film resonator, lattice filter including spaced apart strips of a first conductive film positioned on a substrate so as to define a first set of I/O terminals, a layer of piezoelectric material positioned on the first conductive film, and spaced apart conductive strips of a second conductive film positioned on the piezoelectric layer orthogonal to the first strips to form cross-over areas, each defining a thin film resonator and a second set of I/O terminals. A plurality of portions of a dielectric film are positioned on selected cross-over areas to mass load the thin film resonators so as to lower the resonant frequency.

The thin film resonators are positioned very close together and made by standard semiconductor fabrication processes so that they are very similar to each other and hence allow good cancellation when used in a lattice filter configuration. Because the thin film resonators are very similar, the mass loading by a dielectric film can be performed easily on all of the selected thin film resonators on a wafer in a single step.

BRIEF DESCRIPTION OF THE DRAWINGS

Referring to the drawings.

DESCRIPTION OF THE PREFERRED EMBODIMENTS

Turning now to the drawings, FIGS. 1–4 are simplified and greatly enlarged sectional views illustrating several steps in a specific process of fabricating a thin film piezoelectric resonator with sealed cavity. Depending on the thin film materials used, additional layers of insulation, protective films, encapsulation, etc. may be required and all such layers and films have been omitted herein for simplification and better understanding of the invention. The specific structure and fabrication method illustrated is for exemplary purposes only and other methods of fabricating a lattice filter in accordance with the present invention can be devised including but not limited to substrate etching, sacrificial layers, reflecting impedance matching layers, etc. For the purpose of disclosing a method of fabricating thin film resonators on a substrate, U.S. Pat. No. 5,373,268, issued Dec. 13, 1994, with the title "Thin Film Resonator Having Stacked Acoustic Reflecting Impedance Matching Layers and Method", is incorporated herein by reference.

Figure 1:
FIGS. 1–4 are simplified cross-sectional views of various stages in the fabrication of a thin film resonator.

In this specific embodiment, for purposes of explanation, the following fabrication method is utilized. Referring specifically to FIG. 1, a first substrate 10 is illustrated having an upper planar surface 11. Substrate 10 can be any convenient material that is easily workable, e.g. any of the well known semiconductor materials. In the present specific example, substrate 10 is a silicon wafer normally used for fabricating semiconductor products.

A cavity 12 is formed in upper planar surface 11 of substrate 10 by any convenient means. It should be understood that only a portion of the wafer including substrate 10 and only one cavity 11 are illustrated in the drawings, however substrate 10 may include a plurality of cavities 12, all of which would be formed simultaneously. In this preferred embodiment cavity 12 is formed by patterning upper planar surface 11 using a mask, photoresist, etc. and etching substrate 10, in a manner well known in the art.

A second substrate 14 having a planar surface is provided and a layer 15, generally of dielectric material, is positioned on the planar surface of second substrate 14 so as to form a planar surface 16 at the junction of substrate 14 and layer 15. It should be understood that only a portion of a wafer including substrate 14 is illustrated in the drawings, however the entire surface of substrate 14 may be covered with layer 15 or layer 15 may be patterned on the surface only in positions overlying cavity or cavities 12. Layer 15 is formed of a material which is distinguished by planar surface 16 being bondable to planar surface 11 of first substrate 10. Also, the material of layer 15 is distinguished by second substrate 14 being selectively etchable from layer 15. In this preferred embodiment, for example, substrate 14 is a silicon wafer (as described in conjunction with substrate 10) and layer 15 is an oxide layer (SiO$_2$) grown on the planar surface of substrate 14 by any of the well known oxidation techniques.

Figure 2:
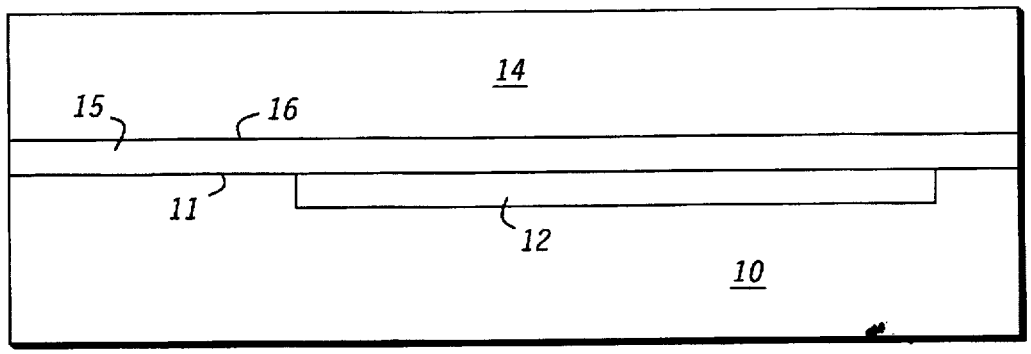

Referring specifically to FIG. 2, the surface of layer 15 is bonded to planar surface 11 of substrate 10 so as to overlie at least cavity 12. It will be understood that any bonding technique can be used for this purpose, such as adhesives or other chemicals, wafer bonding, etc. In this preferred embodiment a standard wafer bonding technique is utilized, i.e. the mating surfaces are polished to ensure planarity and the surfaces are simply joined (placed in juxtaposition) and heated to provide a firm chemical bond.

Figure 3:
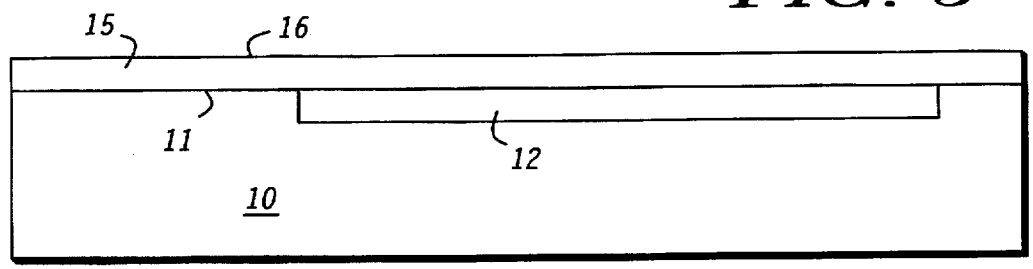

Substrate 14 is then machined to a convenient thickness by grinding and/or polishing, and the remaining portion of substrate 14 is removed by etching, utilizing standard semiconductor etch techniques. It will be understood that the amount of machining and/or etching will depend upon the original thickness and the resonant frequency of the material utilized. In this preferred embodiment and for simplicity of operation, the entire wafer (substrate 14) is removed by machining and etching to expose surface 16, as illustrated in FIG. 3. During the etching process, layer 15 of silicon dioxide forms a natural etch stop to ensure that too much material is not removed.

Figure 4:
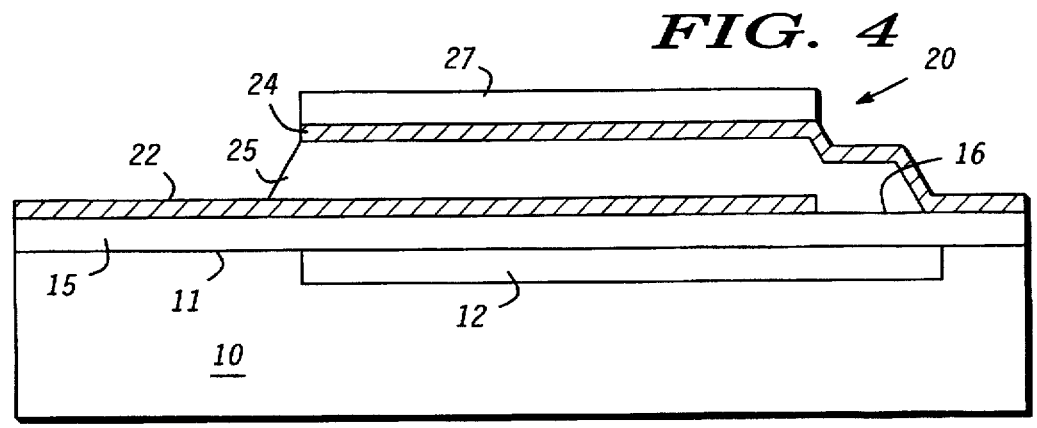

Referring specifically to FIG. 4, a thin film resonator structure 20 is then fabricated on planar surface 16 of layer 15 in overlying relationship to cavity 12. Resonator structure 20 includes a first electrode 22, positioned on surface 16 of layer 15 in overlying relationship to cavity 12, and a second electrode 24 overlying first electrode 22 with a piezoelectric film 25 sandwiched therebetween. In a manner well known in the resonator fabrication art, first electrode 22 is formed on surface 16, piezoelectric film 25 is deposited on electrode 22 and second electrode 24 is deposited on the surface of piezoelectric film 25. It will be understood that electrodes 22 and 24 can be formed utilizing any of the well known techniques, such as, for example, vacuum deposition of a convenient metal, electroless deposition, etc.

Here it should be noted that a plurality of individual piezoelectric resonators are fabricated on a single wafer and, since each resonator is relatively small (on the order of a few hundred microns on each side) and the plurality of resonators are formed close together, each resonator will be very similar to each adjacent resonator. Utilizing the described fabrication techniques, the required number of piezoelectric resonators are fabricated on a single substrate or wafer and electrically connected to form a desired piezoelectric filter configuration. In the present embodiment, the electrical connections are patterned on the wafer at the same time that electrodes 22 and 24 are patterned on the wafer.

For reliable operation and good decoupling, the thickness of layer 15 is nominally half the thickness of the piezoelectric resonator. In the preferred embodiment, the thickness of oxide layer 15 grown on silicon substrate 14 can be controlled very accurately. Further, since layer 15 forms a natural etch stop during the removal of substrate 14, the thickness of layer 15 is not substantially altered during the remainder of the fabrication process. Also, because in the preferred embodiment cavity 12 is formed by etching and layer 16 is grown the desired thickness and bonded to substrate 10, the completed piezoelectric resonator can be fabricated much smaller than prior art resonators and a plurality of resonators (generally for a specific filter) can be formed very close together. It should be noted that a cavity 12 can be formed for each resonator or all of the resonators in a specific filter could be mounted on a single cavity, if desired.

After piezoelectric layer 25 and electrodes 22 and 24 of resonator structure 20 are completed, the resonant frequency can be altered by the application of a film 27 of material on the upper surface of electrode 24. Film 27 can be any convenient dielectric material, such as silicon nitride (Si$_3$N$_4$), silicon oxide, or a heavier material, such as additional metal. In a preferred embodiment film 27 is silicon nitride that is applied by plasma enhanced chemical vapor deposition. In operation, film 27 mass loads resonator structure 20 and generally lowers the resonant frequency. As is known in the art, the resonant frequency is directly related to the square root of the mass loading the resonator divided by the stiffness constant of the resonator. Thus, the thickness of layer 27 is chosen to provide a desired change in the resonant frequency.

Figure 5:
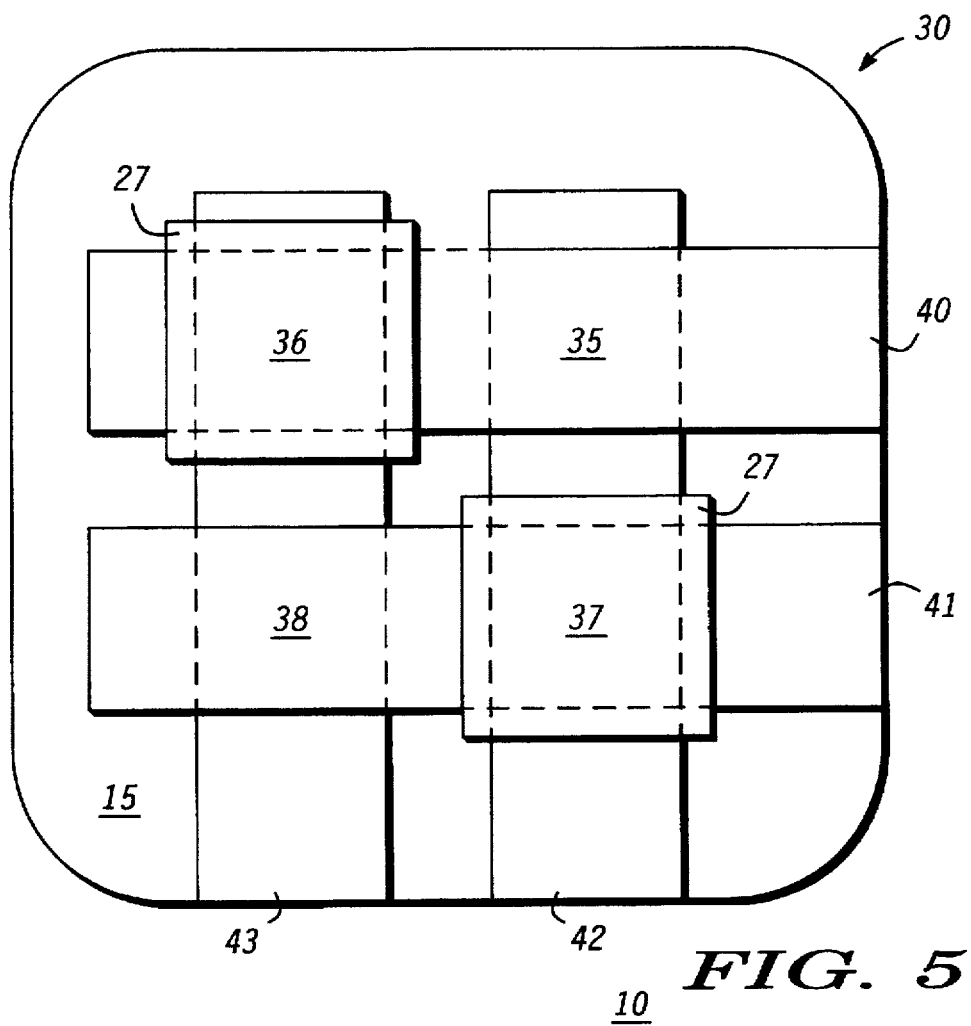
FIG. 5 is a view in top plan of a monolithic thin film resonator, lattice filter in accordance with the present invention.

Referring to FIG. 5, a view in top plan of a monolithic thin film resonator, lattice filter 30 in accordance with the present invention is illustrated. Filter 30 includes a two by two array of resonators 35, 36, 37 and 38 with terminals 40, 41, 42 and 43. Each of the resonators 35–38 are constructed as described above except that a first conductive film is positioned on the substrate 10 and separated into a pair of spaced apart conductive strips so as to define the first set of I/O terminals 40 and 41.

Areas for resonators 35–38 are defined on the conductive strips and a quartz blank or thin film piezoid is placed over all of the areas, in this preferred embodiment. It should be understood, however, that individual piezoelectric layers can be placed on each resonator if desired. However, utilizing a single blank or layer has a tendency to make all four of resonators 35–38 more uniform and similar to each other, which allows good cancellation when used in a lattice filter configuration.

Figure 6:
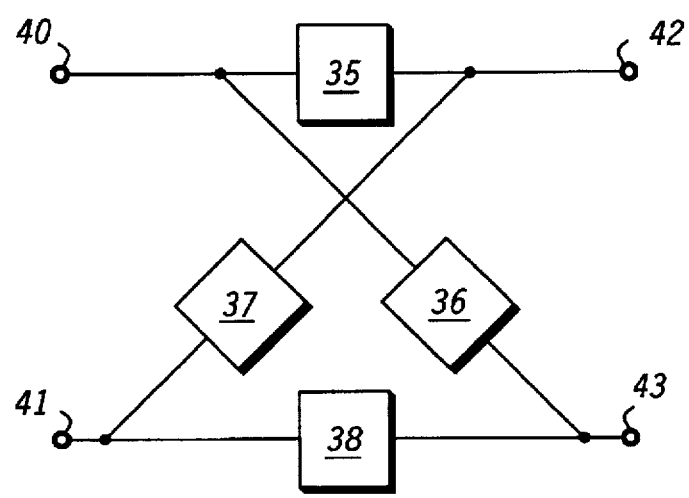
FIG. 6 is a simplified schematic representation of the structure of FIG. 5.

A second conductive film is positioned on the piezoelectric film and separated into a pair of spaced apart conductive strips so as to define the second set of I/O terminals 42 and 43. The second pair of spaced apart conductive strips are oriented generally orthogonal to the first set of conductive strips so that each of the second pair of conductive strips overlies a portion of each of the first pair of conductive strips with the overlying areas being the previously defined areas for resonators 35–38. The result is that the four resonators are connected into a lattice filter configuration, as illustrated schematically in FIG. 6.

Resonators 36 and 37 are then mass loaded with the film 27 to change the frequency a desired amount and produce a frequency offset between resonators 35, 38 and resonators 36, 37. It will of course be understood that resonators 35 and 38 could be mass loaded, instead of resonators 36 and 37, if desired. Depending on the extent of capacitive loading for narrow bandwidths, the frequency offset between pairs of resonators may be as much as having a pole of one pair coincide with a zero of the other pair. Since resonators 35–38 are fabricated very close together and made by standard semiconductor fabrication processes, they are very similar to each other and hence allow good cancellation when used in the lattice filter configuration. Also, fabricating resonators 35–38 over a cavity in the substrate allows them to be very closely packed, which would not be realizable using the prior art back substrate via process.

Figure 7:
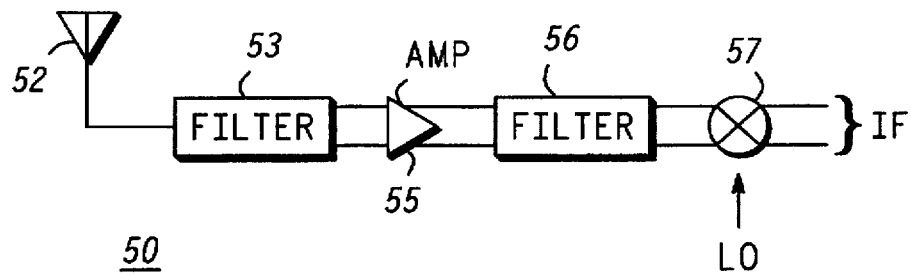
FIG. 7 is a simplified block diagram of a receiver front-end with the lattice filter illustrated in FIG. 5 incorporated therein.

Referring specifically to FIG. 7, a simplified block diagram of a receiver front-end 50 with the lattice filter of FIG. 5 incorporated therein is illustrated. Front-end 50 includes a receiving antenna 52 connected through an unbalanced, single-ended filter 53 to a single-ended input of a balun amplifier 55. The balun output of amplifier 55 is connected through a balanced filter 56, similar to lattice filter 30 of FIG. 5, to the balanced inputs of a mixer 57. Differential circuits, such as differential amplifier 55 and mixer 57, improve on intermodulation components, causing less distortion, and inherently include common mode cancellation.

Figure 8:
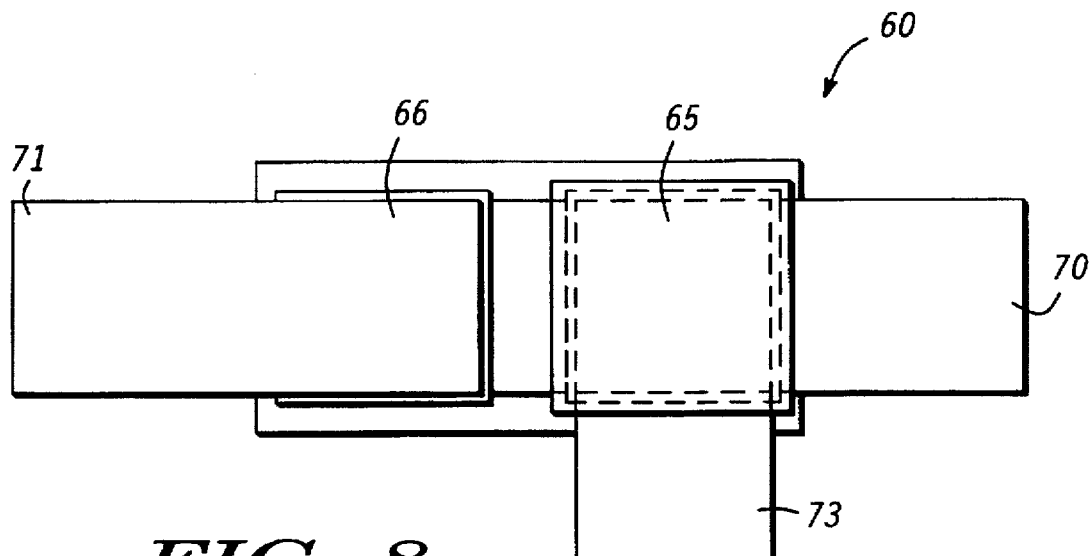
FIG. 8 is a view in top plan of another monolithic thin film resonator, lattice filter in accordance with the present invention.

Referring to FIG. 8, a view in top plan of another monolithic thin film resonator, lattice filter 60 in accordance with the present invention is illustrated. Filter 60 includes a one by two array of resonators 65 and 66 with terminals 70, 71 and 73 operating as a common terminal. Each of the resonators 65 and 66 are constructed as described above except that only resonator 65 is mass loaded in this embodiment. Depending on the extent of capacitive loading for narrow bandwidths, the frequency offset between the pair of resonators 65 and 66 may be as much as having a pole of one resonator coincide with a zero of the other resonator. Since resonators 65 and 66 are fabricated very close together and made by standard semiconductor fabrication processes, they are very similar to each other and hence allow good cancellation when used in the lattice filter configuration.

Figure 9:
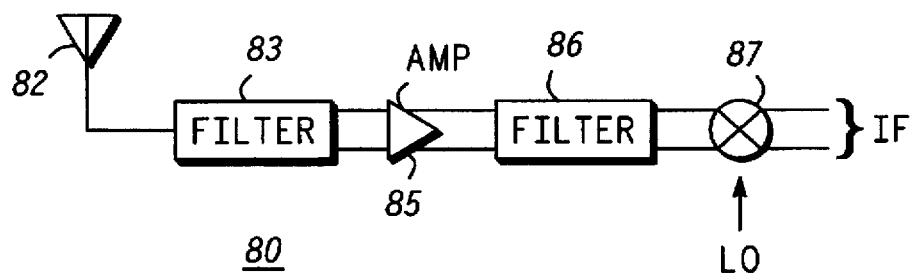
FIG. 9 is a simplified block diagram of a receiver front-end with both of the lattice filters illustrated in FIGS. 5 and 8 incorporated therein.

Referring specifically to FIG. 9, a simplified block diagram of another receiver front-end 80 with both the lattice filters of FIGS. 5 and 8 incorporated therein is illustrated. Front-end 80 includes a receiving antenna 82 connected through a half lattice filter 83, similar to lattice filter 60 in FIG. 8, to the two input of a differential amplifier 85. The differential output of amplifier 85 is connected through a balanced filter 86, similar to lattice filter 30 of FIG. 5, to the balanced inputs of a mixer 87. The use of half-lattice filter 83 converts the signal to a differential pair earlier in front end 80 so as to improve and simplify the structure.

Thus, an improved array of thin film piezoelectric resonators is disclosed and convenient methods for connecting the resonators into a lattice filter or other filter types, such as a Wheatstone bridge configuration, etc. if desired. Previously, there have been no thin film resonators formed into the lattice filter configuration, only stacked filters and ladder filters. Lattice filters are the most versatile type of filters and they have wider bandwidths compared to the ladder filters under identical process capability and resonator designs (piezoelectric material and metallization process), i.e. technology figures of merit q/r being equal, because of the inherent cancellation of the static capacitance of the resonators in the lattice configuration.

The lattice filter disclosed is a balanced circuit which can conveniently be used with, for example, differential amplifiers and other differential circuits. The differential circuits improve on intermodulation components, causing less distortion, and inherently include common mode cancellation. Further, the thin film processing allows operation of the filters at high frequencies and the novel layout allows simple processing and connection of the lattice filter, for example, without cross-overs, which cross-overs in prior art result in non-planar circuits. In addition, realizing the filter circuit with a wafer bonding technology allows smaller dimensions for the resonator area or areas, making the process more manufacturable as well as lower cost. The final filter circuits have the advantages of wider bandwidth and lower insertion loss compared with ladder filters realized with the same technology. Also, the processes are much simpler compared with stacked resonator filters. In addition the new filters are easily used in modem circuitry where the low voltage operation is tending toward differential amplification.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of fabricating a monolithic thin film resonator, lattice filter comprising the steps of:

providing a supporting substrate with a planar surface;

positioning a first conductive film on the planar surface of the supporting substrate, the first conductive film being separated into a first pair of spaced apart conductive strips defining a first set of I/O terminals;

positioning a layer of piezoelectric material on the first conductive film;

positioning a second conductive film on the layer of piezoelectric material, the second conductive film being separated into a second pair of spaced apart conductive strips positioned orthogonal to the first pair of conductive strips with each of the second pair of conductive strips overlying a portion of each of the first pair of conductive strips at cross-over areas and defining a second set of I/O terminals, each of the cross-over areas defining a thin film resonator with a resonant frequency and the thin film resonators being arranged in a two by two array; and positioning one each of two portions of a dielectric film of material on two of the cross-over areas to mass load two thin film resonators defined by the two cross-over areas and alter the resonant frequency of the two thin film resonators which are mass loaded, the two thin film resonators being positioned along a diagonal of the two by two array.

2. A method of fabricating a monolithic thin film resonator, lattice filter as claimed in claim 1 wherein the step of providing a supporting substrate includes the steps of:

providing a first substrate with a planar surface;

forming a cavity in the planar surface of the first substrate;

providing a second substrate with a planar surface;

positioning a layer of material on the planar surface of the second substrate so as to form a planar surface on the layer of material parallel with the planar surface of the second substrate, the layer of material being distinguished by being bondable to the planar surface of the first substrate, the layer of material being further distinguished by the second substrate being selectively etchable from the layer of material;

bonding the planar surface of the layer of material to the planar surface of the first substrate in overlying relationship to the cavity; and etching a portion of the second substrate from the layer of material to expose an etched planar surface in an area overlying the cavity.

3. A method of fabricating a monolithic thin film resonator, lattice filter as claimed in claim 2 wherein the step of positioning the first conductive film on the planar surface of the supporting substrate includes positioning the first conductive film on the etched planar surface in the area overlying the cavity.

4. A method of fabricating a monolithic thin film resonator, lattice filter as claimed in claim 1 wherein the step of positioning the first conductive film includes depositing a layer of aluminum.

5. A method of fabricating a monolithic thin film resonator, lattice filter as claimed in claim 1 wherein the step of positioning the second conductive film includes depositing a layer of aluminum.

6. A method of fabricating a monolithic thin film resonator, lattice filter as claimed in claim 1 wherein the step of positioning one each of the plurality of portions of the dielectric film of material includes selectively depositing a layer of silicon nitride.

7. A method of fabricating a monolithic thin film resonator, lattice filter as claimed in claim 6 wherein the step of selectively depositing the layer of silicon nitride includes depositing the layer of silicon nitride using plasma enhanced chemical vapor deposition.

8. A method of fabricating a monolithic thin film resonator, lattice filter as claimed in claim 1 wherein the step of positioning the portions of dielectric film of material to mass load the thin film resonators includes forming the portions with a thickness such that the thin film resonators are mass loaded sufficiently to lower the resonant frequency of the thin film resonators and produce a frequency offset between mass loaded and unloaded thin film resonators an amount less than that required for a pole of one thin film resonator to coincide with a zero of another thin film resonator.

* * * * *